United States Patent
Kwon

(10) Patent No.: US 8,006,966 B2
(45) Date of Patent: Aug. 30, 2011

(54) GLASS SUPPORT PIN

(75) Inventor: O Jun Kwon, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 540 days.

(21) Appl. No.: 11/824,044

(22) Filed: Jun. 29, 2007

(65) Prior Publication Data

US 2008/0159835 A1    Jul. 3, 2008

(30) Foreign Application Priority Data

Dec. 29, 2006    (KR) .................. 10-2006-0138950

(51) Int. Cl.
*B23Q 3/14* (2006.01)
(52) U.S. Cl. ............... 269/48.1; 269/900; 269/48.2
(58) Field of Classification Search .............. 269/900, 269/138, 292, 294, 310, 266, 265, 21, 47, 269/48.1, 48.2, 48.3, 49, 53, 9, 54.3, 67, 269/289 R, 903, 296, 129, 133, 156, 157, 269/160, 161, 163, 217, 229, 232, 239, 235, 269/234, 267; 401/92; 156/345.51; 81/302, 81/345, 13; 279/2.04, 2.12; 349/60, 58; 254/100, 104; 248/685, 565, 603, 309.2, 248/316.2; 108/55.3, 50.12; 414/267, 277; 294/100, 87.12; 33/27.02; *B23Q 3/10*
See application file for complete search history.

(56) References Cited

U.S. PATENT DOCUMENTS

| | | | | |
|---|---|---|---|---|
| 2,271,012 | A | * | 1/1942 | Hutchings .................. 269/48.2 |
| 5,224,690 | A | * | 7/1993 | Vaught ....................... 269/48.3 |
| 6,023,901 | A | * | 2/2000 | Jensen ........................... 52/514 |

* cited by examiner

*Primary Examiner* — Lee D Wilson
*Assistant Examiner* — Jamal Daniel
(74) *Attorney, Agent, or Firm* — Brinks Hofer Gilson & Lione

(57) ABSTRACT

A glass support pin for supporting a glass substrate for use with a liquid crystal display device is provided. In one embodiment, the glass support pin includes a plurality of branch pins, and one or more elastic members. The plurality of branch pins is structured to have top ends. The top ends of the branch pins are spread outwardly in the radial direction. The one or more elastic members are attached to the branch pins. The glass support pin is open by pulling the top ends of the branch pins outwardly according to a longitudinal movement of the glass support pin.

7 Claims, 6 Drawing Sheets

GLASS SUPPORT PIN

PRIORITY CLAIM

This application claims priority to and the benefit of Korea Patent Application No. 10-2006-0138950 filed in Republic of Korea on Dec. 29, 2006, which is hereby incorporated by reference in its entirety.

BACKGROUND

1. Technical Field

The present invention relates to an apparatus for fabricating a flat panel display device and, more particularly, to a glass support pin for use with fabrication of a liquid crystal display (LCD) device.

2. Description of Related Art

Fabrication of LCD devices involves many unit processes at factory facilities. Each unit process performs a different operation required for fabricating LCD devices. LCD fabrication process may involve delivery of a glass substrate where an LCD device is mounted. Many unit processes are automated and rely on a robot. In particular, a transfer robot may deliver the glass substrate from one unit process facility to a different unit process facility.

An aligning unit performs an aligning process of the LCD glass substrate before the LCD glass substrate is kept in storage in the cassette or before the LCD glass substrate is loaded to the different facility. The aligning unit includes glass support pins supporting the LCD glass substrate and an aligning member that aligns the LCD glass substrate. During the aligning process, the aligning member moves the LCD glass substrate to an alignment position by using the glass support pins. Frictional contact may occur between the LCD glass substrate and the glass support pins. Frictional contact may cause scratches or cracks on the surface of the LCD glass substrate.

The LCD glass substrate typically has a thickness of about 0.7 mm to 2.2 mm, which is substantially smaller than its length and width. Because the LCD glass substrate is so thin and large, it may not be highly resistant to an external impact and sagging phenomenon. The sagging phenomenon may occur from severe bending caused by self-weight of the LCD glass substrate. Additionally, as an LCD panel becomes larger in size, the crack occurrence rate may increase upon lifting of the glass substrate with the glass support pins. Further, a wet liquid coating film such as a photoresist film may flow down to generate blurs. The coating film may be formed with uneven thickness.

FIGS. 1A and 1B are a plan view and a cross sectional view showing an arrangement of glass support pins 22 and a carrier plate 5 according to the related art. Referring to FIGS. 1A and 1B, the carrier plate 5 comprises a chuck 21 and the glass support pins 22. The glass support pins 22 support a glass substrate 10. A robot arm transports the glass substrate 10 and puts it on the chuck 21. The glass substrate 10 is then vacuum-absorbed onto the surface of the chuck 21. Subsequently, the surface of the glass substrate 10 is coated with the photoresist film using equipment such as a photoresist coater.

The glass support pins 22 are lifted from the chuck 21 to support the glass substrate 10 until the transfer robot takes off the glass substrate 10 from the chuck 21. The glass support pins 22 are typically arranged at intervals of 340 mm in width and 365 mm in length, and total 36 glass support pins 22 support weight of the glass substrate 10 in FIG. 1A. A load applied to each support pin may be substantial. The transfer robot transfers the glass substrate 10 to a facility for a next process. The robot arm is moved toward a bottom surface of the glass substrate 10 between the glass support pins 22 and the chuck 21, as shown in FIG. 1B.

FIG. 2 further illustrates the glass support pins 22 in detail according to the related art. Reference character 'L' denotes the length of the large glass substrate 10, and 'd' denotes the distance between the glass support pins 22. Each glass support pin includes a body 22a and a tip 22b formed on the top of the body 22a. Referring to FIG. 2, a height difference exists between portions P1 and portions P2. The portions P1 are not supported by the glass support pins 22 on the chuck 21 and the portions P2 are supported by the glass support pins 22 on the chuck 21. This difference may result from the weight of the large glass substrate 10. The portions P1 may bend in the glass substrate 10, which may lead to crack on the rear surface of the glass substrate 10. Accordingly, there is a need for a glass support pin and a carrier plate that overcome drawbacks of the related art.

SUMMARY

By way of example, in one embodiment, a glass support pin for supporting a glass substrate for use with a liquid crystal display device is provided. The glass support pin includes a plurality of branch pins, and one or more elastic members. The plurality of branch pins is structured to have top ends. The top ends of the branch pins are spread outwardly in the radial direction. The one or more elastic members are attached to the branch pins. The glass support pin is open by pulling the top ends of the branch pins outwardly according to a longitudinal movement of the glass support pin.

In other embodiment, a carrier plate is provided which operates to deliver a glass substrate for use with a liquid crystal display device. The carrier plate includes a plurality of glass support pins, a chuck. A glass support pin is structured to support the glass substrate and includes a plurality of branch pins. The glass support pin is opened to separate the branch pins and is closed to adjoin the branch pins according to its vertical movement. The chuck includes a plurality of openings which receives the plurality of glass support pins. As the glass support pin is lifted from the chuck, it is opened and as the glass support pin is inserted into an opening of the chuck, the glass support pin is closed In another embodiment, a delivery system for use with a liquid crystal display device configured to be formed on a glass substrate includes a chuck and a plurality of glass support pints. The chuck is structured to support the glass substrate. The glass substrate is vacuum-absorbed on the surface of the chuck. A glass support pin includes a plurality of branch pins which are spread outwardly as the each glass support pin is lifted from the chuck. The glass support pin is closed as it moves toward the chuck. The glass support pin is structured to contact and support the glass substrate at multiple positions substantially simultaneously.

BRIEF DESCRIPTION OF THE DRAWINGS

The implementation of this document will be described in detail Referring to the following drawings in which like numerals refer to like elements.

DETAILED DESCRIPTION OF EMBODIMENTS AND DRAWINGS

Hereinafter, the glass support pin and a carrier plate according to embodiments will be described in detail referring to the attached drawings.

Figure 1A:
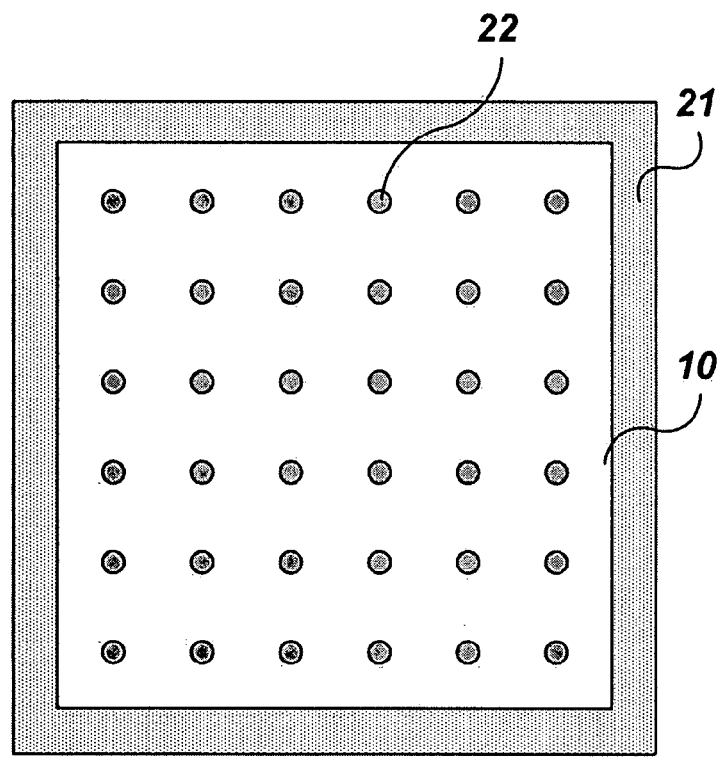
FIGS. 1A and 1B are a plan view and a cross sectional view showing an arrangement of glass support pins according to the related art.
Figure 1B:
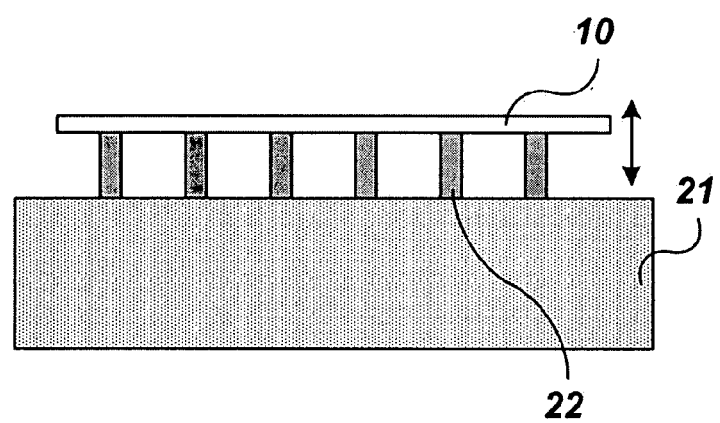
Figure 2:
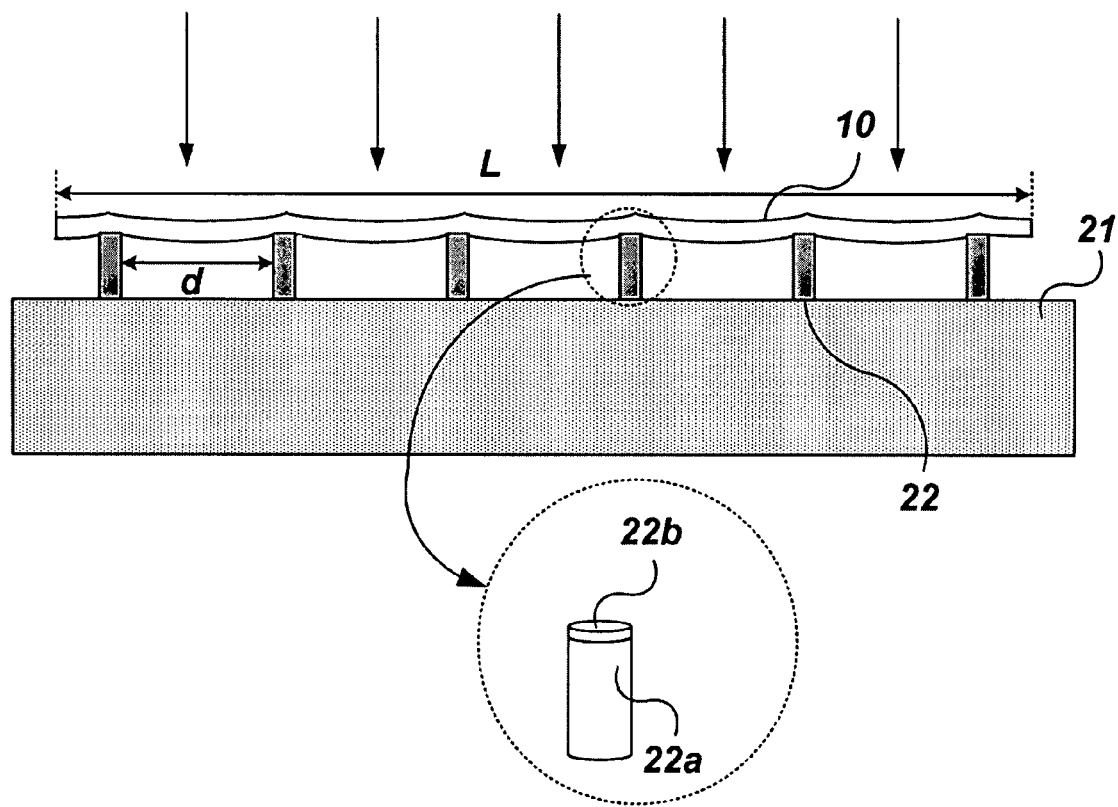
FIG. 2 further illustrates the glass support pins and a carrier plate according to the related art.
Figure 3:
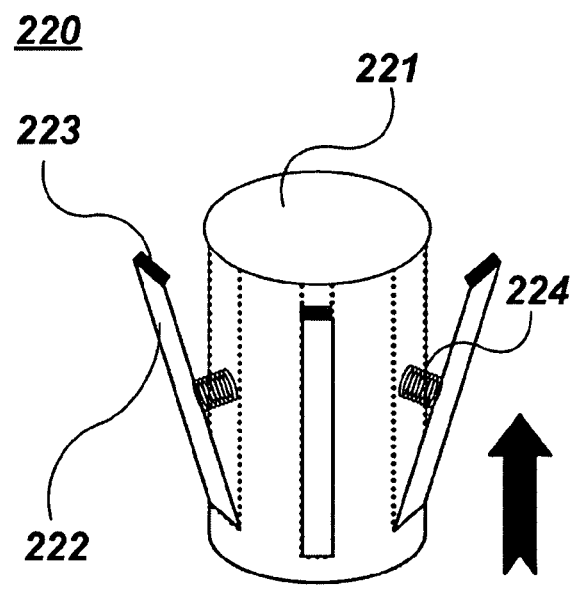
FIG. 3 illustrates a first embodiment of a glass support pin having a lifted state.
Figure 4:
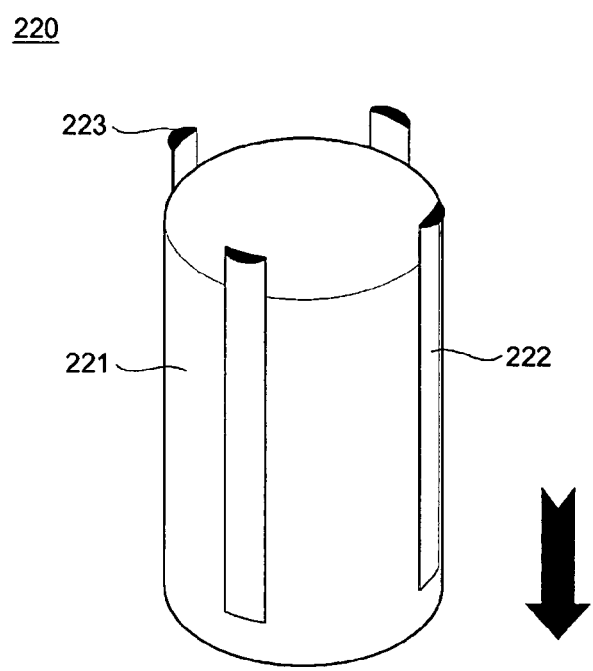
FIG. 4 illustrates the glass support pin of FIG. 3 having a closed state.

FIGS. 3 and 4 illustrate a glass support pin according to a first embodiment. The glass support pin 220 is subject to a vertical movement indicated in 227 and 229. In particular, the glass support pin 220 is lifted from a chuck (see 210 of FIGS. 5A and 5B) or lowered toward the chuck in a direction of a rear surface of a glass substrate (see FIGS. 5A and 5B). Specifically, FIG. 3 shows the lifted state of the glass support pin 220 and FIG. 4 shows the closed state of a glass support pin 220. The glass support pin 220 includes a base pin 221, a plurality of branch pins 222, and elastic members 224.

Each branch pin 222 is branched from the base pin 221. A lower end portion of each branch pin 222 is fixed at the base pin 221 and an upper end portion thereof is branched from the base pin 222 to support the glass substrate when the glass support pin 220 is lifted. Each branch pin 222 includes a tip 223 formed on its top portion. The tip 223 substantially contacts and supports the rear surface of the glass substrate.

The plurality of branch pins 222 is spread radially and outwardly from the base pin 221. By way of example, the plurality of branch pins 222 may be spread outwardly at an angle which ranges about 30° to about 60° with reference to the base pin 221. The branch pins 222 may be preferably pulled outwardly at an angle of about 30° or more to support the glass substrate. Alternatively, or additionally, the pulling angle of the branch pins 222 may be smaller than about 60° to avoid interference with a robot arm.

The plurality of branch pins 222 may be made from Poly Ether Ether Ketone (PEEK) or a stainless steel material with good heat resistance and good chemical resistance. In particular, each tip of the branch pins contacting the glass substrate may be made from PEEK and each support portion of the branch pins may be made from SUS. The glass support pins used for a liquid crystal display (LCD) have a diameter of 5Φ and a length of about 100 mm to about 200 mm, and they are made of the materials including SUS and PEEK. The tip 223 of the glass support pin 220 contacting the glass substrate may have a hemispherical shape or a cylindrical shape. Various other materials and shapes are possible.

The elastic members 224 are inserted and positioned between the base pin 221 and the plurality of branch pins 222. The elastic members 224 transfer a tensile force, which allows the branch pins 222 to be separate from the base pin 221, as shown in FIG. 3. In this embodiment, the elastic member 224 may be made from a spring or a plate spring, but various other materials may be used.

Referring to FIG. 4, the plurality of branch pins 222 are in the closed state. The branch pins 222 move back to their original position and are closed such that they contact the base pin 221. At this time, the glass support pin 220 is lowered toward the chuck (229).

Figure 5A:
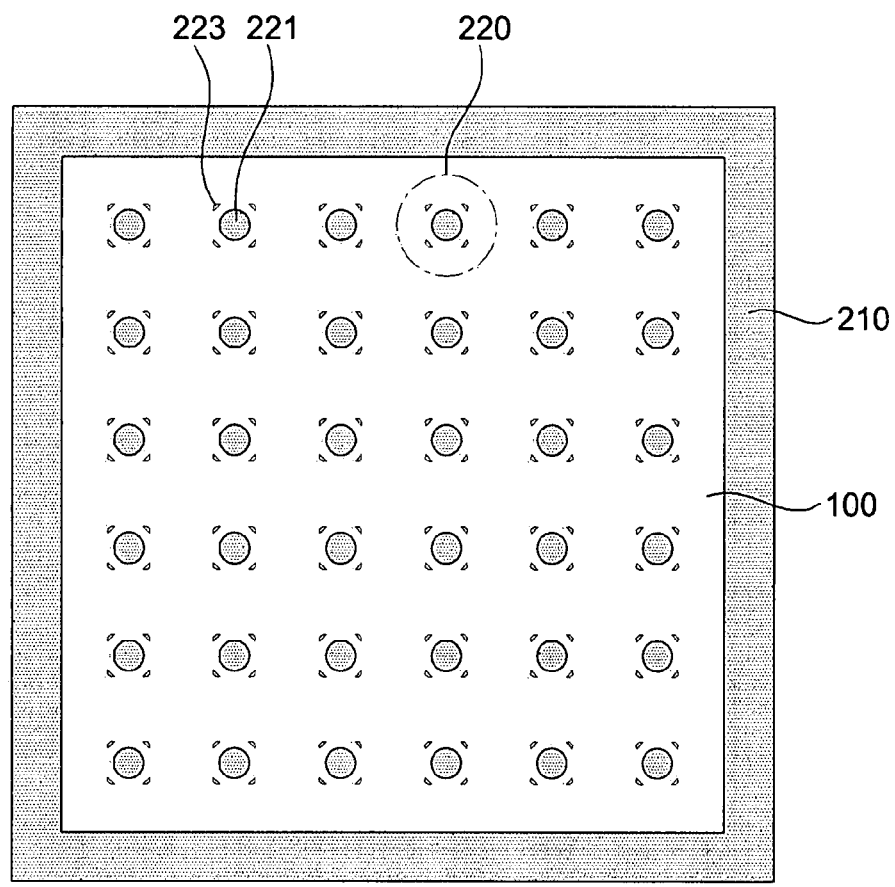
FIGS. 5A and 5B are a plan view and a cross sectional view of the glass support pins of FIG. 3.
Figure 5B:
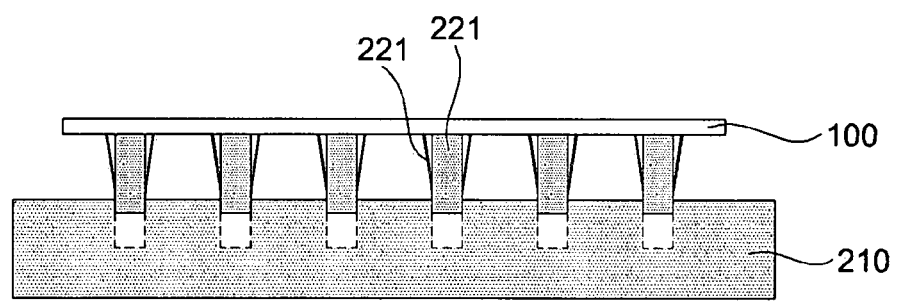

FIGS. 5A and 5B are a plan view and a cross sectional view illustrating an arrangement of glass support pins 220. Referring to FIG. 5A, a total number of the base pins 221 and the branch pins 222 may be over one hundred pins, for example. For instance, the total number would range between 108 and 252. FIG. 5A shows thirty six (36) base pins 221 and one hundred forty four (144) branch pins 222 as each glass support pin 220 is branched to one base pin 221 and four branch pins 222.

FIG. 5B shows that the glass support pins 220 are lifted from the chuck 210 to support a glass substrate 100. In FIG. 5B, the glass substrate 100 is vacuum-absorbed on the surface of the chuck 210. The surface of the glass substrate 100 is coated with a photoresist film using equipment such as a photoresist coater. At this time, the glass support pins 220 are lifted from the chuck 210 to support the glass substrate 100 until a transfer robot takes off the glass substrate 100. When a particular unit process is completed, the transfer robot transfers the glass substrate 100 to a next process.

In this case, support load applied to each glass support pin 200 may be considerably reduced. Accordingly, the crack occurrence rate with respect to the glass substrate 100 may be reduced. As a result, the production yield may substantially improve. Additionally, a larger glass surface may be supported with an increased number of pins (e.g., over 100 or more pins). A uniform coating film may be maintained during the transfer process of the glass substrate 100.

Figure 6A:
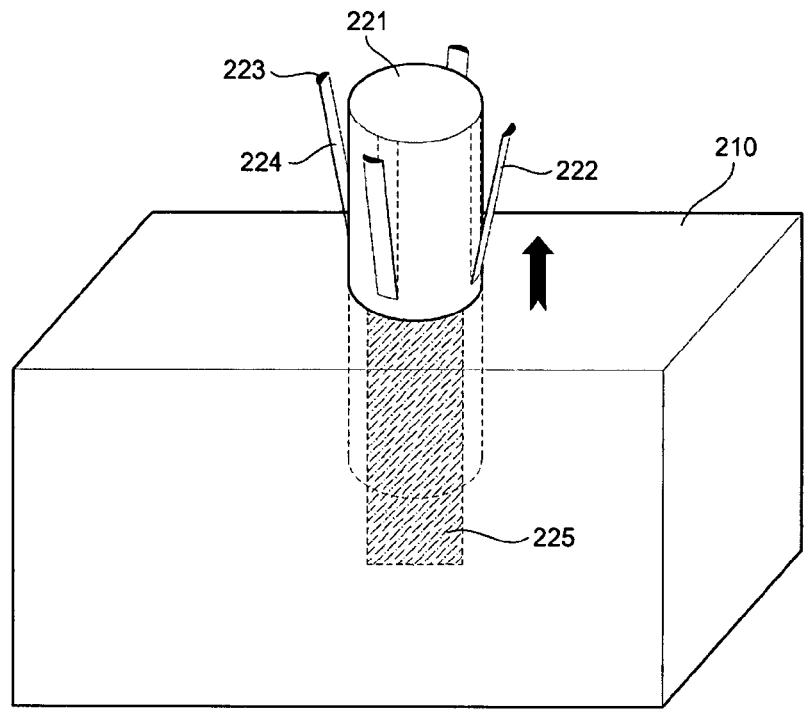
FIGS. 6A and 6B illustrate a carrier plate having the glass support pin in the lifted state and in the closed state, respectively.
Figure 6B:
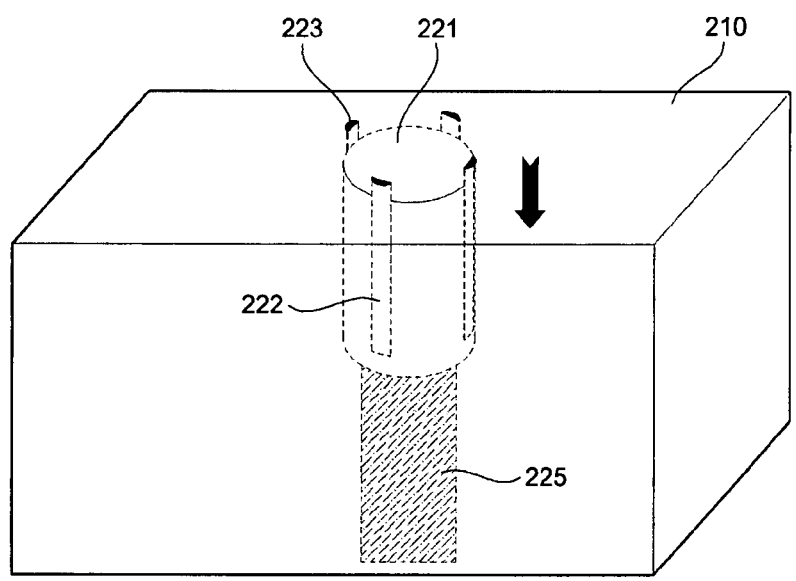

FIGS. 6A and 6B illustrate a carrier plate having the glass support pin 220 in the lifted state and the lowered state, respectively. The glass substrate 100 loaded on a general cassette is moved onto a carrier plate 200 by the transfer robot. The chuck 210 vacuum-absorbs the glass substrate 100 and has a hole where the glass support pin 220 and a driving shaft 225 are placed. The driving shaft 225 serves to lift or lower the base pin 221 of the glass support pin 220 from or to the chuck 210. The driving shaft 225 is connected to a sub-motor.

The glass support pin 220 includes the base pin 221 which is lifted (227) or lowered (229) in the direction of the rear surface of the glass substrate 100. The branch pins 222 are branched from the base pin 221 and support the rear surface of the glass substrate 100. In this embodiment, about two to six branch pins 222 may be connected to the spring 224 or the like (see FIG. 3), and they are moveably positioned at the base pin 221 of the glass support pin 220 due to the spring 224.

The branch pins 222 are spread out bisymmetrically with reference to the base pin 221. The branch pins 222 distribute support for the glass substrate at multiple positions. As noted above, a maximum spread range of the branch pins 222 is set to avoid interference with the transfer robot and the robot arm.

FIG. 6B shows the glass support pin 220 in the inserted state into the chuck 210 and the branch pins 222 are closed. Referring to FIGS. 4 and 6B, the plurality of branch pins 222 is closed toward the base pin 221 when they are moving lowered into the chuck 210. The glass support pin 220 is inserted into the hole formed on the chuck 210 and at this time, the branch pins 222 are closed by the inner wall of the hole.

Figure 7:
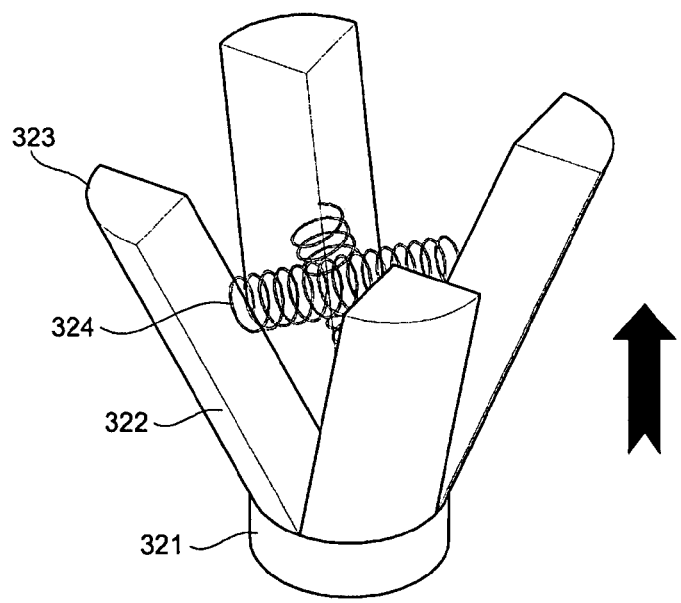
FIG. 7 illustrates a second embodiment of a glass support pin in a lifted state.
Figure 8:
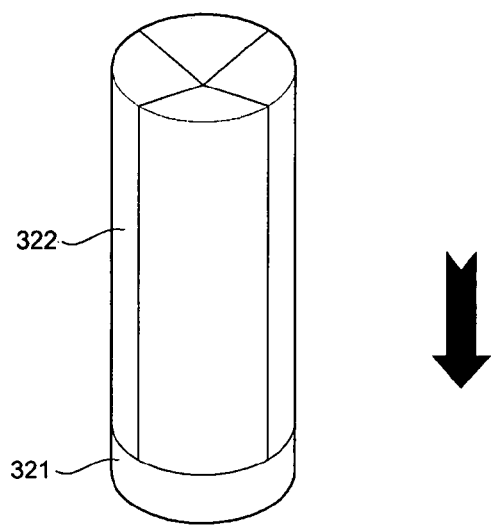
FIG. 8 illustrates the glass support pin of FIG. 7 in the closed state.

FIG. 7 illustrates a second embodiment of a glass support pin 320. In FIG. 7, the glass support pin 320 is in an open state. FIG. 8 illustrates the glass support pin 320 in a closed state. Referring to FIG. 7, the glass support pin 320 includes a base member 321, a plurality of branch pins 322, and a plurality of elastic members 324. The base member 321 is lifted from and lowered toward the chuck 210 in the direction of the rear surface of the glass substrate. Each branch pin includes a body 322 and a tip 323, which support the rear surface of the glass substrate.

Each lower end portion of the branch pins is fixed with the base member 321 and each upper end portion is separated (325) and supports the rear surface of the glass substrate 100. The tip 323 is attached on top of the body 322 and contacts the rear surface of the glass substrate 100 for support. The plurality of branch pins 322 is combined into a cylindrical shape, and is divided symmetrically upon opening. The elastic members 324 are positioned between the branch pins 322, and provide a tensile force for allowing the upper end portions to be separated from one another. FIG. 8 shows the branch pins when the branch pins are closed as they are inserted in the chuck (327).

As described above, the glass support pins according to the embodiments are opened and closed (spread out or furled up) according to the vertical movement. The glass support pins are structured to provide a large number of support pins to support a larger glass, for instance, 1,950 mm×2,250 mm. Further, the uniformity of the glass support surface may improve. In addition, load applied to each glass support pin may be reduced because the load is shared by the larger number of branch pins. Crack occurrence rate of the glass substrate may be lowered. The glass substrate production yield may improve.

Although the invention has been shown and described with embodiments, it will be understood by those skilled in the art that various changes in form and details may be made therein without departing from the spirit and scope of the invention as defined by the appended claims. Accordingly, embodiments of the invention as set forth herein are intended to be illustrative and not limiting.

I claim:

1. A carrier plate which operates to deliver a glass substrate for use with a liquid crystal display device, comprising:
    a plurality of glass support pins, a glass support pin structured to support the glass substrate and including a plurality of branch pins wherein the glass support pin is opened to separate the branch pins and is closed to adjoin the branch pins according to its longitudinal movement, wherein the each branch pin is structured to have a top surface which is:
    substantially facing away from the rest of the branch pin at an outermost tip of the branch pin in the longitudinal direction,
    substantially parallel to the glass substrate when the glass support pin is open, and sloped downwards towards the central longitudinal axis of the glass support pin when the glass support pin is closed, and
    configured to contact and to support the glass substrate at multiple positions as the glass support pin is open, and
    a chuck comprising a plurality of openings which receives the plurality of glass support pins,
    wherein as the glass support pin is lifted from the chuck, it is opened and as the glass support pin is inserted into an opening of the chuck, the glass support pin is closed.

2. The carrier plate of claim 1, wherein a single glass support pin is configured to contact the glass substrate at multiple positions.

3. The carrier plate of claim 1, wherein the opening of the chuck comprises an inner wall and the branch pins are pushed inwardly by the inner wall as the glass support pin is inserted into the opening of the chuck.

4. The carrier plate of claim 1, wherein the glass support pin comprises a plurality of elastic members that moveably secures the branch pins.

5. The carrier plate of claim 3, wherein the branch pins are spread outwardly as the glass support pin is lifted out of the opening of the chuck.

6. The carrier plate of claim 1, wherein the opening of the chuck comprises an inner wall and the branch pins frictionally contact the inner wall as the glass support pin is inserted into the opening of the chuck.

7. A delivery system for use with a liquid crystal display device configured to be formed on a glass substrate, comprising:
    a chuck structured to support the glass substrate wherein the glass substrate is vacuum-absorbed on the surface of the chuck; and
    a plurality of glass support pins, a glass support pin comprising a plurality of branch pins which are spread outwardly as the glass support pin is lifted from the chuck and which are closed as the glass support pin moves toward the chuck wherein the glass support pin and the each branch pin are structured to have a top surface which is:
    substantially facing away from the rest of the branch pin at an outermost tip of the branch pin in the longitudinal direction, substantially parallel to the glass substrate when the glass support pin is open, and sloped downwards towards the central longitudinal axis of the glass support pin when the glass support pin is closed, and
    configured to contact and to support the glass substrate at multiple positions substantially simultaneously.

* * * * *